(12) United States Patent
Liew et al.

(10) Patent No.: US 11,156,491 B2
(45) Date of Patent: Oct. 26, 2021

(54) INDUCTIVE SENSOR ASSEMBLY FOR FLUID MEASUREMENTS

(71) Applicants: TE CONNECTIVITY CORPORATION, Berwyn, PA (US); Tyco Electronics Canada ULC, Markham (CA); TE CONNECTIVITY GERMANY GmbH, Bensheim (DE); TE CONNECTIVITY INDIA PRIVATE LIMITED, Bangalore (IN); Tyco Electronics NZ Limited, Auckland (NZ)

(72) Inventors: Yiyang Liew, Winston Salem, NC (US); Earl Daniel Swope, Kernersville, NC (US); Christopher Couch, Troy, MI (US); Lucian Iordache, Woodbridge (CA); Tobias Becker, St. Leon-Rot (DE); Kiranpal Singh, Mysore (IN); Mathias Michael, Auckland (NZ); Oliver Schaaf, Lustadt (DE)

(73) Assignees: TE CONNECTIVITY CORPORATION, Berwyn, PA (US); TYCO ELECTRONICS CANADA ULC et al., Markham (CA)

( * ) Notice: Subject to any disclaimer, the term of this patent is extended or adjusted under 35 U.S.C. 154(b) by 225 days.

(21) Appl. No.: 16/276,690

(22) Filed: Feb. 15, 2019

(65) Prior Publication Data
US 2020/0232834 A1    Jul. 23, 2020

(30) Foreign Application Priority Data

Jan. 17, 2019  (IN) .............................. 201911002105

(51) Int. Cl.
*G01F 23/68* (2006.01)
*G01F 23/26* (2006.01)
(Continued)

(52) U.S. Cl.
CPC .......... *G01F 23/261* (2013.01); *F01M 11/12* (2013.01); *G01F 23/68* (2013.01); *H05K 1/181* (2013.01); *H05K 2201/1003* (2013.01)

(58) Field of Classification Search
CPC .......... H05K 1/181; H05K 2201/1003; F01M 11/12; G01F 23/261; G01F 23/68
See application file for complete search history.

(56) References Cited

U.S. PATENT DOCUMENTS 2,337,608 A * 12/1943 Hulsberg ................ G01F 23/68
                                                    73/313
2,626,017 A *  1/1953 Bibko .................... F01M 11/12
                                                    184/103.2
(Continued)

OTHER PUBLICATIONS

Coto Technology "Liquid Level Sensing Using Reed Switch Technology" Coto Technology; 2016 (3 pages).
(Continued)

*Primary Examiner* — David J Bolduc

(57) ABSTRACT

A sensor assembly that includes a sealed housing. A printed circuit board assembly including a first section that includes processing circuitry is disposed within the sealed housing and a second section that includes detection circuitry extends from the sealed housing. The sensor assembly also includes a conductive target movably coupled to the second section of the printed circuit board to vary net voltage of the detection circuitry as the conductive target moves along the second section to provide an output signal. The processing circuitry detects the output signal and converts the output signal into a linear representation of position of the conductive target in relation to the second section.

21 Claims, 7 Drawing Sheets

(51) Int. Cl.
*F01M 11/12* (2006.01)
*H05K 1/18* (2006.01)

(56) References Cited

U.S. PATENT DOCUMENTS

| | | | | |
|---|---|---|---|---|
| 2,660,059 | A * | 11/1953 | Dean | G01F 23/66 73/313 |
| 3,124,795 | A * | 3/1964 | Zardi | G01G 23/18 341/15 |
| 3,675,235 | A * | 7/1972 | Wayman | H03M 1/26 341/10 |
| 3,784,973 | A * | 1/1974 | Burgett | G01F 23/30 340/450.2 |
| 3,819,857 | A * | 6/1974 | Inokuchi | G06F 3/046 178/18.07 |
| 4,014,015 | A * | 3/1977 | Gundlach | G01D 5/12 341/10 |
| 4,027,233 | A * | 5/1977 | Shmakov | G01F 23/261 324/224 |
| 4,125,022 | A * | 11/1978 | Sumida | G01F 23/68 73/313 |
| 4,255,975 | A * | 3/1981 | Debreuille | E21B 47/00 33/313 |
| 4,299,307 | A * | 11/1981 | Scott | F01M 11/12 184/1.5 |
| 4,305,283 | A * | 12/1981 | Redding | G01F 23/2963 73/290 V |
| 4,552,991 | A * | 11/1985 | Hulls | G06F 3/046 178/20.04 |
| 4,697,144 | A * | 9/1987 | Howbrook | G06F 3/046 324/207.17 |
| 4,723,446 | A * | 2/1988 | Saito | G01B 7/02 324/207.17 |
| 4,831,878 | A * | 5/1989 | Hayashi | G01F 23/00 73/290 R |
| 4,891,980 | A * | 1/1990 | Kawai | G01F 23/68 324/207.17 |
| 4,989,560 | A * | 2/1991 | Rasdal | F01M 11/04 123/196 S |
| 5,196,824 | A * | 3/1993 | Helm | F01M 11/12 340/450.3 |
| 5,210,380 | A * | 5/1993 | McDermott | G06F 3/041 178/18.07 |
| 5,233,355 | A * | 8/1993 | Di Stefano | G01D 5/36 340/870.28 |
| 5,327,997 | A * | 7/1994 | Nash, Jr. | F04B 39/0207 184/103.2 |
| 5,483,831 | A * | 1/1996 | Steiner | G01F 23/686 73/313 |
| 5,841,274 | A * | 11/1998 | Masreliez | G01D 5/2053 324/207.17 |
| 5,950,487 | A * | 9/1999 | Maresca, Jr. | G01F 23/706 250/577 |
| 6,124,708 | A * | 9/2000 | Dames | G01D 5/2053 324/207.12 |
| 6,192,753 | B1 * | 2/2001 | Czarnek | G01D 5/2046 73/290 R |
| 6,192,754 | B1 * | 2/2001 | Czarnek | G01D 5/2046 73/290 R |
| 6,271,661 | B2 * | 8/2001 | Andermo | G01D 5/2495 324/207.17 |
| 6,561,022 | B1 * | 5/2003 | Doyle | A47J 31/4457 73/313 |
| 6,601,000 | B1 * | 7/2003 | Barlian | A01J 11/02 702/45 |
| 10,494,967 | B1 * | 12/2019 | Osthelder | B63H 20/002 |
| 2001/0054312 | A1 * | 12/2001 | Czarnek | G01F 23/72 73/313 |
| 2003/0023397 | A1 * | 1/2003 | Parlor, Sr. | G01F 23/0069 702/127 |
| 2006/0117847 | A1 * | 6/2006 | Lo | G01F 23/686 73/313 |
| 2006/0267751 | A1 * | 11/2006 | McCormick | F01M 11/0408 340/450.3 |
| 2007/0101811 | A1 * | 5/2007 | Nyce | G01P 3/50 73/304 C |
| 2007/0186648 | A1 * | 8/2007 | Harmon | G01F 23/72 73/319 |
| 2010/0179747 | A1 * | 7/2010 | McCormick | G08B 21/182 701/112 |
| 2010/0269586 | A1 * | 10/2010 | Beneker | G01F 23/68 73/313 |
| 2011/0012592 | A1 * | 1/2011 | Paradise | G01F 23/68 324/207.16 |
| 2012/0097482 | A1 * | 4/2012 | Miller | G01F 23/0046 184/6.4 |
| 2013/0139586 | A1 * | 6/2013 | Czarnek | G01F 23/683 73/313 |
| 2017/0045492 | A1 * | 2/2017 | Surman | G01F 23/261 |
| 2018/0199425 | A1 * | 7/2018 | Edlinger | H05K 1/111 |
| 2019/0118540 | A1 * | 4/2019 | Chen | B41J 2/17513 |
| 2019/0120678 | A1 * | 4/2019 | Cumbie | B41J 2/17566 |
| 2019/0301920 | A1 * | 10/2019 | Sclip | G01F 23/62 |

OTHER PUBLICATIONS

Integrated Device Technology, Inc. "Inductive Position Sensor IC" Integrated Device Technology, Inc; 2018; (33 pages).

Integrated Device Technology, Inc. "ZMID520x Inductive Position Sensor Family" Integrated Device Technology, Inc (2 pages).

* cited by examiner

INDUCTIVE SENSOR ASSEMBLY FOR FLUID MEASUREMENTS

CROSS-REFERENCE TO RELATED APPLICATIONS

This application claims benefit to Indian Application No. 201911002105, which was filed Jan. 17, 2019 and is titled INDUCTIVE SENSOR ASSEMBLY FOR FLUID MEASUREMENTS. The subject matter of which is herein incorporated by reference in its entirety.

BACKGROUND OF THE INVENTION

The subject matter herein relates generally to inductive sensors and manufacturing methods for making the same.

Many different types of sensors are utilized to determine the fluid level in a fixed volume compartment. In one example, in the automotive industry oil levels are often measured by sensors to determine oil levels within an oil pan. Such determination is instrumental to the operation of a vehicle to prevent engine wear and to prevent unnecessary environmental pollution that can cause the engine to fail environmental regulations. Additionally, as autonomous vehicles continue to advance and become prevalent, systems that more closely monitor oil levels to ensure such proper operation become more desired.

Current fluid-monitoring sensors utilize various electronic and mechanical components to determine the fluid level within the compartment. These sensors can have certain drawbacks or limitations. For example, ultrasound sensors may not be suitable for colder environments or for liquids that are agitated. Such circumstances often occur during operation of an engine. Moreover, the size and/or shape of the sensor may render it incompatible with other design requirements.

Accordingly, there is a need for a fluid-level sensor that is cost-effective and can sufficiently measure a level of fluid while permitting different designs compared to known liquid-level sensors.

BRIEF DESCRIPTION OF THE INVENTION

In an embodiment, a sensor system is provided that includes a sealed housing and processing circuitry disposed within the sealed housing and detection circuitry extending from the sealed housing. A conductive target is movably coupled to the substrate to vary net voltage of the detection circuitry as the conductive target moves to provide an output signal. The processing circuitry detects the output signal and converts the output signal into a linear representation of position of the conductive target.

In another embodiment an oil pan assembly is provided with a container that is configured to contain oil. The oil pan assembly also includes a sensor assembly mounted within the container. The sensor assembly includes a sealed housing, and a substrate including a first section that includes processing circuitry disposed within the sealed housing and a second section that includes detection circuitry extending from the sealed housing into the container. The oil pan assembly also includes a float having a conductive target coupled to the second section of the substrate within the container to move along the second section as an oil level of the oil within the container varies.

In another embodiment a sensor assembly is provided that includes a sealed housing, and a printed circuit board assembly including a first section that includes processing circuitry disposed within the sealed housing and a second section extending from the sealed housing, the second section includes a first side that includes first detection circuitry and a second side that includes second detection circuitry. The sensor assembly also includes a conductive target movably surrounding the second section of the printed circuit board to vary net voltage of the first detection circuitry and second detection circuitry as the conductive target moves along the second section to provide an output signal. The processing circuitry detects the output signal and converts the output signal into a linear representation of position of the conductive target in relation to the second section. wherein the conductive target is configured to move along an axis between a first target position and a second target position, wherein a dimension of the conductive target measured along the axis is between 15% and 30% of a distance between the first and second target positions.

DETAILED DESCRIPTION OF THE INVENTION

Embodiments herein include a sensor assembly that is configured to acquire information for determining a volume of liquid within a liquid container apparatus. For example, the sensor assembly may detect a position of a conductive target. The position of the conductive target may correspond to a level of liquid within the liquid container apparatus. In particular embodiments, the liquid container apparatus includes an oil pan, such as for an engine of a vehicle. The sensor assembly includes detection circuitry and processing circuitry. The detection circuitry extends along and is secured to a substrate. The conductive target may move along the substrate. In particular embodiments, the conductive target slides along and is guided by the substrate. Optionally, the detection circuitry and the processing circuitry are parts of a common printed circuit board assembly.

In the illustrated embodiment, the stem portion of the substrate includes the detection circuitry that is disposed within the oil. The detection circuitry includes two receiver coils that are placed with a ninety (90) degree phase difference from one another and are surrounded by a transmission coil. The receiver coils are layered on one another such that five separate induction loops are formed within the transmission coil that provide a net voltage of zero. A conductive target is provided either as a float or within a float and positioned in close proximity to the substrate. As the conductive target moves along the detection circuitry, transmitted energy through the transmission coil dissipates as an eddy current adjacent the conductive target. Consequently, a change in the area receiving energy from the transmission coil, and changes in the magnetic fields of induction loops result. A resulting change in net voltage thus occurs and is detected and determined by the processing circuitry. The processing circuitry is on the substrate and sealed from the oil within the oil pan. The processing circuitry converts the detected voltage change into a linear position dependent output signal to communicate to the vehicle's computer system to provide to a user.

Figure 1:
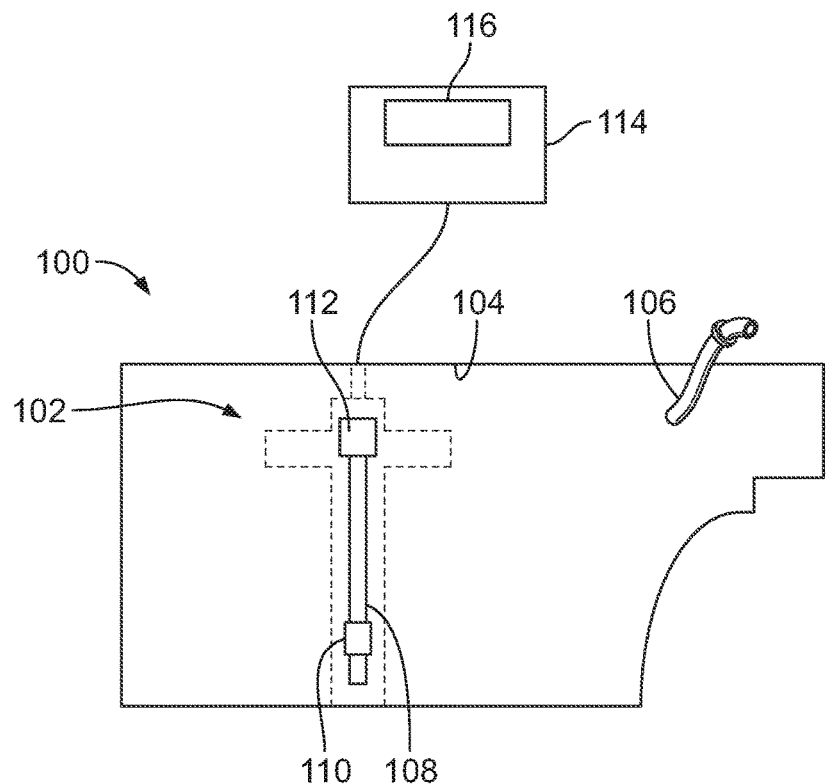
FIG. 1 is a schematic view of a fluid container assembly in accordance with an exemplary embodiment.

FIG. 1 illustrates a schematic diagram of a fluid container assembly 100 utilizing an exemplary sensor assembly 102. The fluid container assembly in one example is an oil pan. The fluid container assembly includes a container 104 that is a fluid reservoir for receiving oil and includes a channel 106 for receiving a dip stick, or measuring stick. The sensor assembly 102 in one example is mounted within the container 104 of the fluid container assembly 100. Alternatively, the sensor assembly 102 may replace a dip or measuring stick within the channel 106 that extends into the container 104. Thus, in this manner the sensor assembly 102 may be mounted exterior to the fluid container assembly 100 and extend into the container 104 of the fluid container assembly 100 through the channel 106.

The exemplary sensor assembly 102 includes detection circuitry 108, a conductive target 110 that varies net voltage of the detection circuitry 108, and processing circuitry 112 for measuring the voltage variance. The processing circuitry 112 is electrically connected to a computing device 114 that includes a display 116 for providing a position, or measurement reading for a user. Specifically, as the conductive target 110 moves in relation to the detection circuitry, voltage variances are detected by the processing circuitry 112 and communicated to the computing device 114. The computing device 114 may include a vehicle's computer system, CPU, handheld device, laptop, smart phone, or the like. The display 116 in one embodiment is a user interface. While shown and described in exemplary embodiments as a sensor assembly 102 within a fluid container assembly 100, the sensor assembly 102 similarly may be used in applications where a force acts upon the conductive target 110 to vary net voltage of the detection circuitry 108 to measure the distance to determine the fluid level within other fluid containers and bodies.

Figure 3:
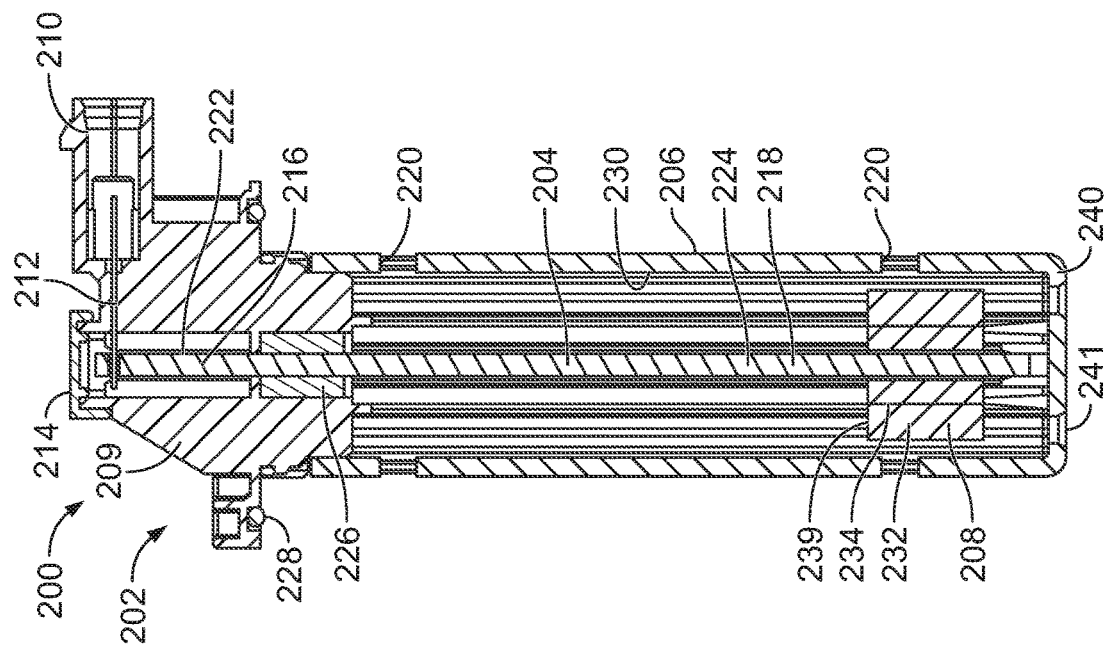
FIG. 3 is a sectional view of a sensor assembly taken along lines 3-3 in FIG. 2 in accordance with an exemplary embodiment
Figure 2:
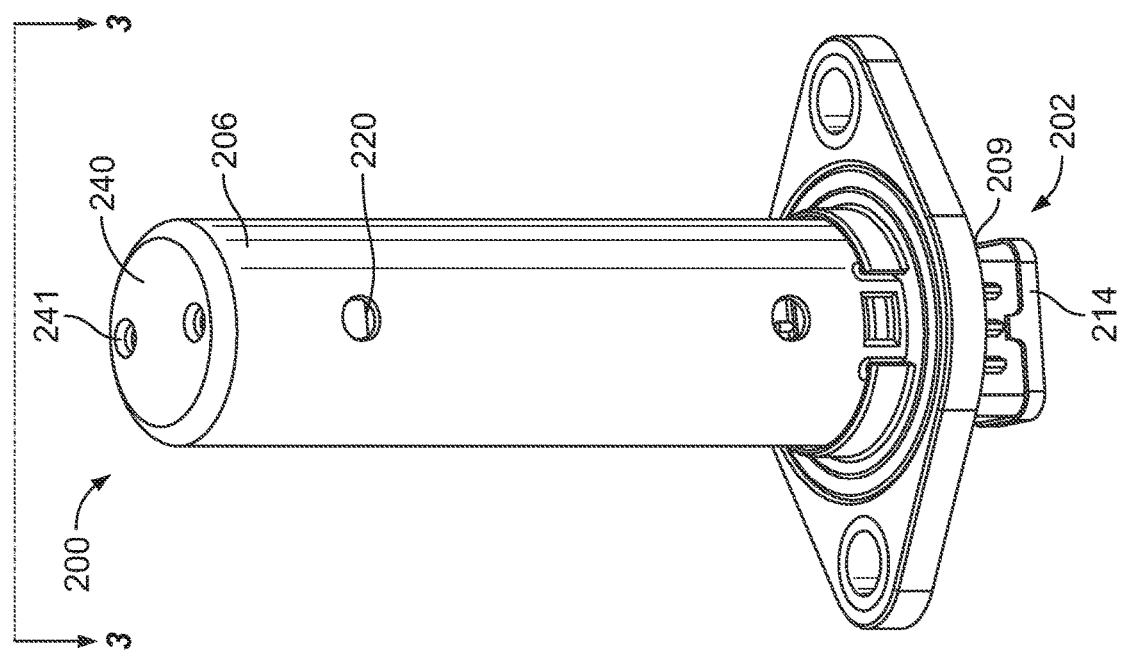
FIG. 2 is perspective view of a sensor assembly in accordance with an exemplary embodiment.

FIG. 2 illustrates a perspective view of an exemplary sensor assembly 200, while FIG. 3 illustrates a sectional view of the sensor assembly 200. In one example the exemplary sensor assembly 200 of FIGS. 2-3 is the sensor assembly 102 of FIG. 1. As illustrated in FIGS. 2-3, the sensor assembly 200 includes a connector 202, a substrate 204 (FIG. 3) within the connector 202 and extending through an open housing 206, and a float 208 movably coupled to the substrate 204. The substrate 204 in one example is a printed circuit board (PCB). In yet another example, the substrate 204 includes environmental protection, such as in one embodiment a conformal coating that is applied after population of the circuitry. Thus, in exemplary embodiments where fluid container assembly is an oil pan, an environmentally protective coating is applied to the substrate 204 to protect the circuitry from oil within the fluid container assembly. In this manner electrical components on the substrate 204 are protected from the oil, preventing malfunctioning.

With reference to FIG. 3, the connector 202 includes a sealed housing 209 that includes a port 210 with electrical terminals 212 disposed therethrough to couple to the substrate 204. The port 210 is configured to receive a plug (not shown) to provide an electrical connection to a computing device (not shown). In one embodiment three terminals 212 are provided and are connected to the substrate 204 through a multi-spring connection. In another embodiment the terminals 212 are also stitched into plastic of the port 210. Additionally, in an embodiment no lead is used in making the terminals and instead silver, copper, gold, platinum, or the like is utilized. While terminals 212 are illustrated in this example for retrofitting within an existing oil pan, circuitry can be provided on the substrate 204 to wirelessly transmit information to a computing device.

The connector 202 also has a first cover member 214 sealingly secured to the sealed housing 209 of the connector 202 to prevent ingress of oil within the sealed housing 209. In one embodiment, the first cover member 214 is laser welded to the sealed housing 209 without a regrind to ensure a robust seal to prevent oil from contaminating circuitry on the substrate 204 within the connector 202.

The substrate 204 in one embodiment is a printed circuit board assembly (PCBA). The substrate extends from a first, or head, section 216 within the sealed housing 209 of the connector 202 to a second, or stem, section 218. In one embodiment, such as when the sensor assembly 200 is a dip or measuring stick of an oil pan, the stem section 218 extends from within the sealed housing 209 of the connector 202 into the oil pan reservoir without the use of an open housing. In another embodiment, such as when the sensor assembly 200 mounts within an oil pan, the stem section 218 extents from within the sealed housing 209 of the connector 202 into the housing 206 of the sensor assembly 200. The open housing 206 of the sensor assembly 200 includes openings 220 to allow for the flow of oil within the housing against the float 208 coupled to the stem section 218.

The substrate 204 includes processing circuitry 222 on the head section 216 within the connector 202. In one example the processing circuitry is embedded in the substrate 204. The processing circuitry 222 can include an integrated circuit (IC) for determining and communicating voltage changes within detection circuitry 224 on the stem section 218. The detection circuitry 224 in one example is embedded in the substrate 204. In an example embodiment where the processing circuitry 222 utilizes an IC, the terminals 212 may be eliminated and a transponder may provide a wireless communication signal received by a remote computing device, such as a vehicles computing computer. The processing circuitry 222 is sealed within the connector 202 with potting 226 disposed within an interior of the connector 202. In an embodiment where no housing is provided, a sealing element 228 may surround the outside of the connector 202 to prevent the ingress of oil within the connector 202. In one embodiment the sealing element 228 is an o-ring.

In an example embodiment, the substrate 204 is at least 2.4 mm thick in order to provide robustness for shock and vibration. In yet another example, the substrate 204 includes a conformal coating that is applied after population of the circuitry to protect the circuitry from the oil. In another embodiment circuitry is fabricated into the substrate 204 to ensure exact trace placement.

The open housing 206 is coupled to the connector 202 to prevent the ingress of oil into the connector 202 while allowing the ingress of oil into an interior chamber 230. In one example, the open housing 206 includes the openings 220 disposed therethrough to allow the flow of oil, or other fluid, within a reservoir or fluid container into the open housing 206. In another embodiment the open housing 206 is a conductive generally cylindrical tube to reduce electrical noise within the system.

The float 208 is disposed within the open housing 206 and in one exemplary embodiment includes an overmold 232 that surrounds a conductive target 234 that surrounds the stem section 218 of the substrate 204. The conductive target 234 partially covers and moves in relation to the detection circuitry 224 on the substrate 204. In one example the overmold 232 and conductive target 234 have a combined density of less than 0.2 gm/cm$^3$ to ensure the float 208 is buoyant within the oil. The conductive target 234 can be made of any conductive material, including metal, conductive plastics, and the like. Similarly, the conductive target 234 may surround the substrate 204, may be moveably mounted on only a single side of the substrate 204, may be within the float 208, may be on the periphery of the float 208 or the like, to be adjacent to, or in close proximity of the detection circuitry 224 on the stem section 218 of the substrate 204.

The conductive target 234 is also configured to allow the float 208 to move over the stem section 218 of the substrate 204 while the periphery of the overmold 232 is configured to allow the float 208 to move within the open housing 206 and within a second cover member 240 that couples to the open housing 206. Specifically, the connector 202 or housing 209 in one example includes compression limiters for mounting sensor assembly 102 and can include a flat surface that optionally contains an o-ring and can be used as Datum for mounting and measurement. Housing 209 also includes a pocket for potting, mechanical stops to prevent float over travel, and latches for retaining the open housing 206. Additionally, in example embodiments the float 208 includes an interface with the connector 202 and the open housing 206 includes a cover member 240.

The second cover member 240 in one example is of one-piece construction with the open housing 206. In another embodiment the second cover member 240 is coupled to the open housing 206 and configured to interface with the latches of the float 208 to retain the float 208 therein. The second cover member 240 also includes openings 241 to allow the conveyance of fluid, or oil to enter and exit the open housing 206. The cover member 240 also interfaces with the substrate 204 to ensure straight travel of the float 208. The cover member 240 also acts as a mechanical stop to prevent the float 208 from moving outside the open housing 206.

Figure 4:
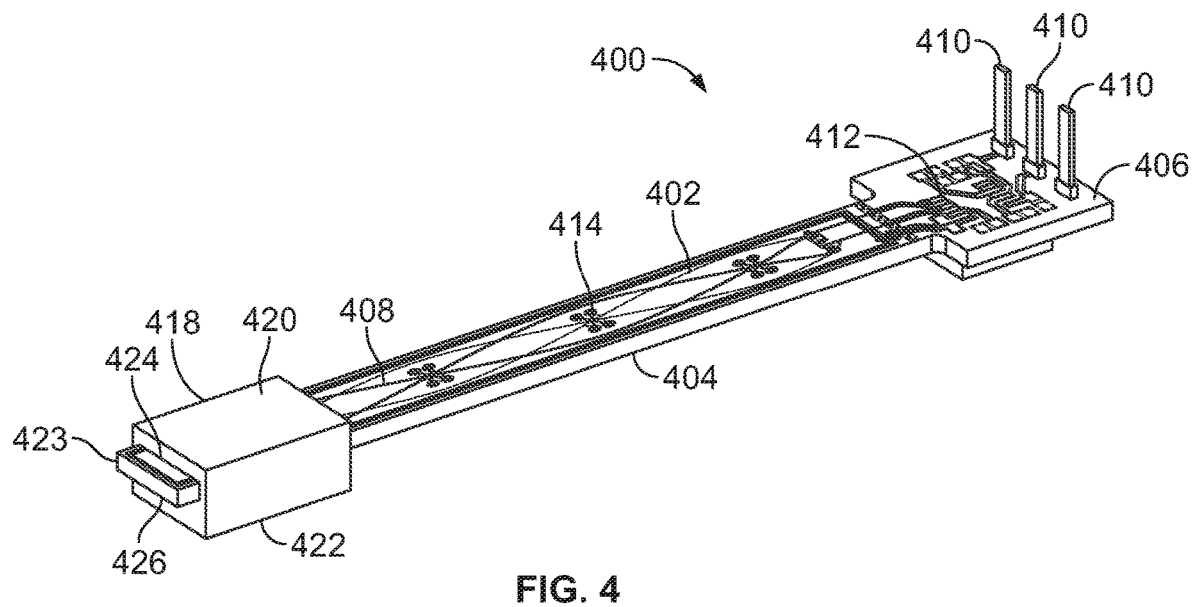
FIG. 4 is a perspective view of a substrate and conductive target of a sensor assembly in accordance with an exemplary embodiment.

FIG. 4 illustrates a perspective view of an exemplary embodiment of a substrate 400 of an exemplary embodiment. In one example the substrate 400 is a PCBA. In yet another example, the substrate 400 includes environmental protection, such as in one embodiment a conformal coating that is applied after population of the circuitry. Thus, in exemplary embodiments where fluid container assembly is an oil pan, an environmentally protective coating is applied to the substrate to protect the circuitry from oil within the fluid container assembly. In this manner electrical components on the substrate 400 are protected from the oil, preventing malfunctioning. The substrate 400 includes a first side 402, second side 404, head section 406, and stem section 408 extending from the head section 406. Terminals 410 are secured to head section 406 and are electrically connected to processing circuitry 412 embedded in the head section.

The stem section 408 includes first detection circuitry 414 embedded on the first side 402 of the substrate and second detection circuitry (not shown) embedded on the second side 404 opposite the first detection circuitry 414 where the first detection circuitry 414 and second detection circuitry are identical. A conductive target 418 is also provided with a first side 420 adjacent the first detection circuitry 414, a second side 422 adjacent the second detection circuitry, and an opening 423 for receiving the stem section 408. In this embodiment the conductive target 418 is of one-piece construction surrounding the stem section 408. Alternatively, a first conductive target section could be placed adjacent the first detection circuitry 414 and a second separate conductive target section placed adjacent the second detection circuitry. In either embodiment, a first air gap 424 is disposed between the first detection circuitry 414 and the first side 420 of the conductive target and a second air gap 426 is disposed between the second detection circuitry and second side 422 of the conductive target 418. By providing this arrangement, as the conductive target 418 moves decreasing the size of the first air gap 424, the size of the second air gap 426 increases in size. Similarly, as the conductive target 418 moves to increase the size of the first air gap 424, the size of the second air gap 426 decreases in size. Specifically, the size of an air gap between detection circuitry and a conductive target determines the amount of noise or inaccuracies in a reading. When an air gap increases in size, the dissipation of current in the detection circuitry as a result of the conductive target decreases resulting in noise and inaccurate readings. By having a four-layer arrangement where first detection circuitry 414 and second detection circuitry are on opposite sides with a first side 420 of a conductive target 418 adjacent the first detection circuitry 414 and a second side 422 of a conductive target 418 adjacent the second detection circuitry the total net air gap of the first and second air gaps 424 and 426 remains the same. Thus, inaccuracies are effectively filtered from the detection circuits.

Figure 5A:
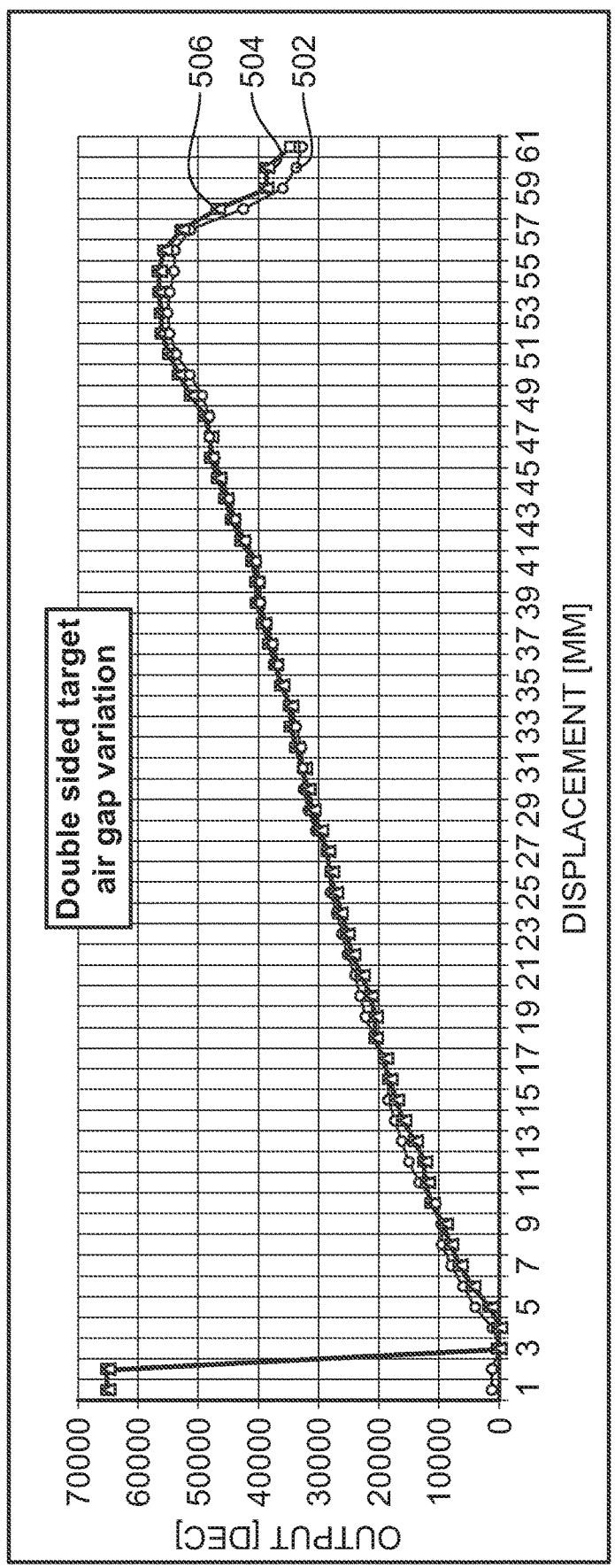
FIG. 5A is a graph of output noise in decimals vs. displacement distance in mm in accordance with an exemplary embodiment.
Figure 5B:
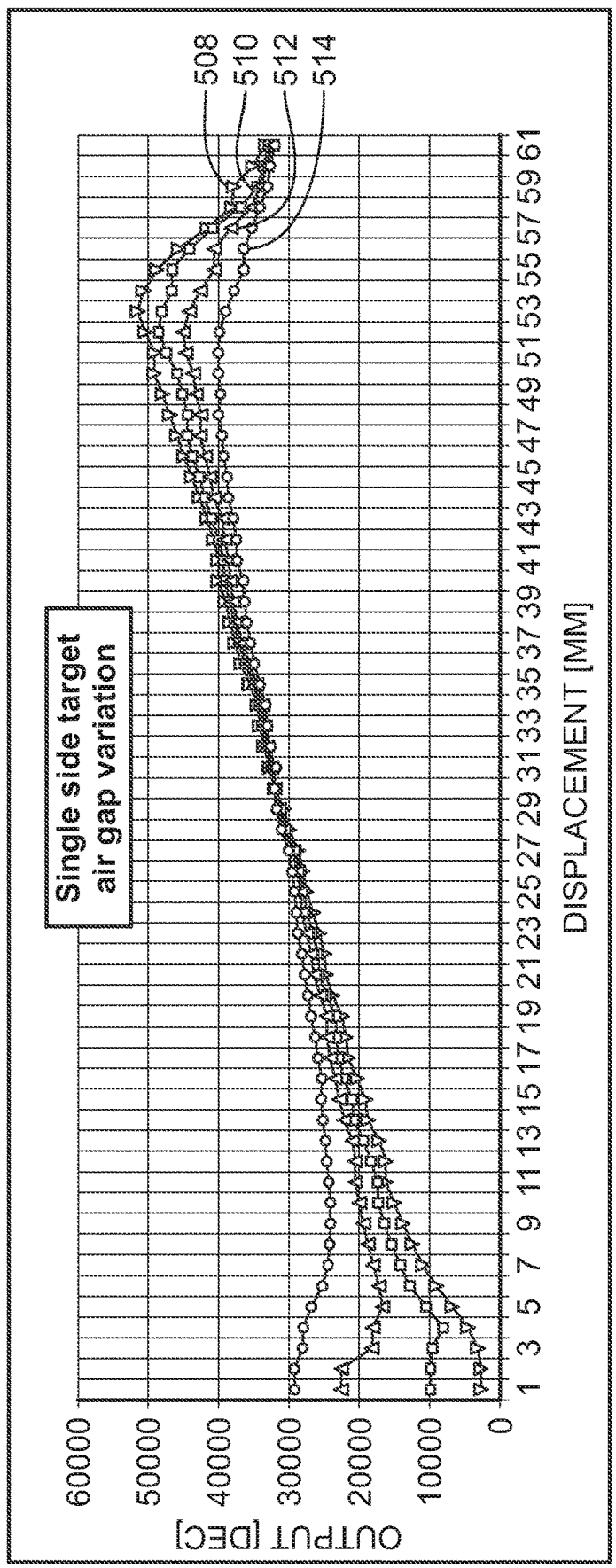
FIG. 5B is a graph of output noise in decimals vs. displacement distance in mm in accordance with an exemplary embodiment.

FIG. 5A illustrates a graph of output in decimals over displacement of a two-sided conductive target over a two-sided substrate and first and second detection circuits as described in FIG. 4. Line 502 illustrates the conductive target in a middle position, while line 504 illustrates the target at 0.5 mm above the middle position and line 506 illustrates the target at 0.5 mm below a middle position. As illustrated, variance from the middle position is limited. Meanwhile FIG. 5B again illustrates a graph of output in decimals over displacement of a sensor assembly, only in this example a two-layer arrangement with a single detection circuitry and a single conductive target adjacent the detection circuitry is utilized. Line 508 illustrates the arrangement when a 1 mm air gap is provided, line 510 illustrates a 1.25 mm air gap, line 512 a 1.5 mm air gap, and line 514 a 2 mm air gap. As illustrated by comparing the graphs, the signal read out is more consistent with less noise and variance for the four-layer arrangement than the two-layer arrangement.

By placing the conductive target surrounding the substrate, variance is limited and a more consistent readings are presented.

Figure 6:
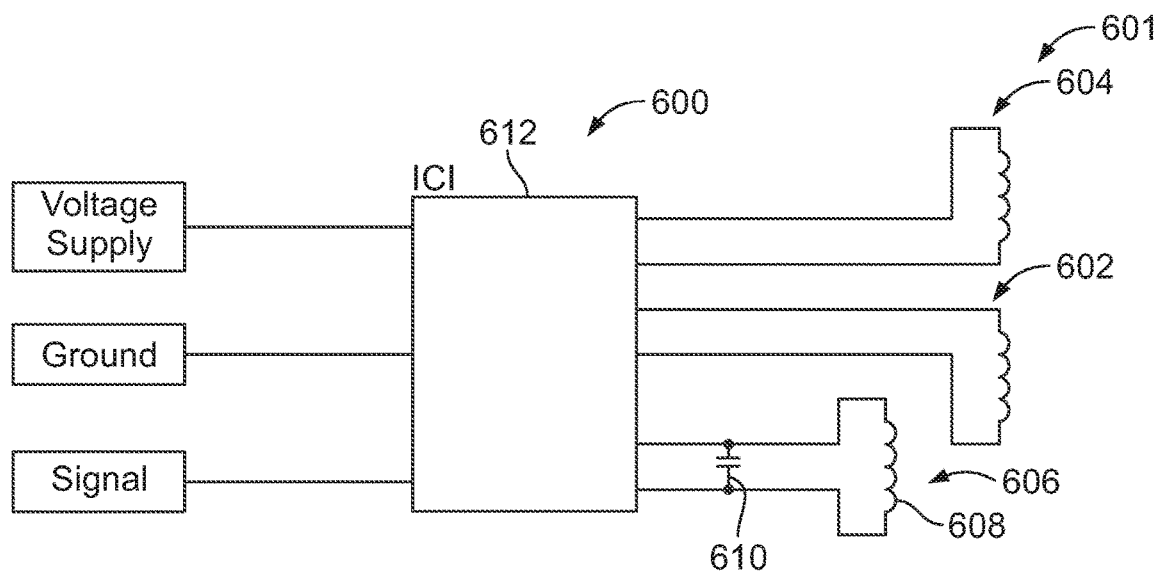
FIG. 6 is a schematic diagram of an electrical system of a sensor assembly in accordance with an exemplary embodiment.

FIG. 6 illustrates a schematic view of an exemplary circuit diagram of the sensor assembly 600. The sensor assembly includes detection circuitry 601 with a first receiver coil 602 and a second receiver coil 604, detection section 606 that includes an inductor 608, capacitor 610 arranged in parallel to the inductor 608, and an IC 612. As previously described, the first receiver coil 602 and second receiver coil 604 provide output signals detected by the detection circuitry 601 that is converted into a linear output representative of the position of a conductive target.

Figure 7A:
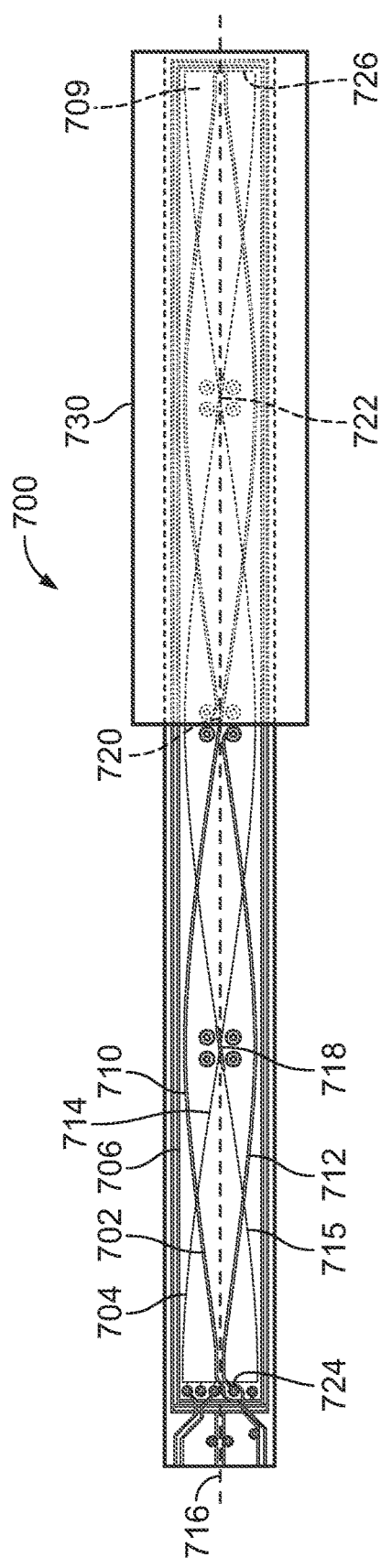
FIG. 7A is side plan view of detection circuitry in accordance with an exemplary embodiment.

FIG. 7A illustrates a view of an exemplary detection circuitry 700 that may be used within the sensor assembly. The detection circuitry 700 in one example is the detection circuitry 224 of FIG. 2 and in another example is the detection circuitry 108 of FIG. 1. The detection circuitry 700 includes a first receiver coil 702, second receiver coil 704, and transmission coil 706.

FIG. 7A illustrates the exemplary detection circuitry 700 with the first receiver coil 702 and transmission coil 706 in a first and fourth layer of a substrate 709 and the second receiver coil 704 in a second and third layer of the substrate 709. In other example embodiment the detection circuitry 700 has the first receiver coil 702 and second receiver coil 704 in a first and fourth layer of a substrate 709 and the transmission coil 706 in a second and third layer of the substrate 709.

The first receiver coil 702 includes a first sinusoidal section 710 and a second sinusoidal section 712. The second receiver coil 704 similarly includes a first sinusoidal section 714 and second sinusoidal section 715. In one embodiment the substrate 709 is a printed circuit board (PCB) and the first receiver coil 702 is a trace on the PCB. In yet another example, the substrate 709 includes environmental protection, such as in one embodiment a conformal coating that is applied after population of the circuitry. Thus, in exemplary embodiments where fluid container assembly is an oil pan, an environmentally protective coating is applied to the substrate to protect the circuitry from oil within the fluid container assembly. In this manner electrical components on the substrate 709 are protected from the oil, preventing malfunctioning. The detection circuitry 700 also includes a central axis 716 that includes first intersecting zero cross 718, second intersecting zero cross 720, and third intersecting zero cross 722.

The first sinusoidal section 710 extends sinusoidally to a local maximum from the first intersecting zero cross 718 on the central axis 716, to the second intersecting zero cross 720. From the second intersecting zero cross 720 the first sinusoidal section 710 extends to a local minimum from the third intersecting zero cross 722. The first sinusoidal section 710 then terminates into the second sinusoidal section 712 at the central axis 716. Portions of the first sinusoidal section 710 above the central axis 716 represent a positive voltage output while portions of the first sinusoidal section 710 below the central axis 716 represent negative voltage outputs.

The second sinusoidal section 712 of the first receiver coil 702 extends sinusoidally to a local minimum from the first intersecting zero cross 718 on the central axis 716, to the second intersecting zero cross 720. From the second intersecting zero cross 720 the second sinusoidal section 712 extends to a local maximum from the third intersecting zero cross 722. The second sinusoidal section 712 then terminates into the first sinusoidal section 710 at the central axis 716.

The second receiver coil 704 extends linearly at a first linear section 724 to the first sinusoidal section 714 of the second receiver coil 704 at a local maximum from the central axis 716. The first sinusoidal section 714 extends sinusoidally from the local maximum to the first intersecting zero cross 718, and then to a local minimum at the second intersecting zero cross 720. From the local minimum at the second intersecting zero cross 720, the first sinusoidal section 714 extends to the third intersecting zero cross 722. From the third intersecting zero cross 722, the first sinusoidal section 714 continues to extend sinusoidally to a local maximum from the central axis 716 and terminates into a second linear section 726.

The second receiver coil 704 also extends linearly at the first linear section 724 to the second sinusoidal section 715 of the second receiver coil 704 at a local minimum from the central axis 716. The second sinusoidal section 715 extends sinusoidally from the local minimum to the first intersecting zero cross 718, and then to a local maximum at the second intersecting zero cross 720. From the local maximum at the second intersecting zero cross 720, the second sinusoidal section 715 extends to the third intersecting zero cross 722. From the third intersecting zero cross 722, the second sinusoidal section 715 continues to extend sinusoidally to a local minimum from the central axis 716 and terminates into the second linear section 726. The second linear section 726 extends from the local minimum at the terminating end of the second linear section 726 to the local maximum at the terminating end of the first sinusoidal section 714, thereby extending transverse to the central axis 716.

While provided in the same period as the first and second sinusoidal sections 710, 712 of the first receiver coil 702, the first and second sinusoidal sections 714 and 715 of the second receiver coil 704 are shifted ninety degrees (90°) from, or orthogonal to the first and second sinusoidal sections 710, 712. In this manner the first receiver coil 702 includes first and second opposing sin sections while the second receiver coil 704 includes first and second opposing cosine sections. As a result of this arrangement, numerous induction loops are formed such that when current is inducted in the circuit first receiver coil 702 and second receiver coil 704, each loop individually produces an output voltage, but in combination provide a net voltage of zero.

The transmission coil 706 generally wraps around and forms a perimeter around the first receiver coil 702 and second receiver coil 704. In one embodiment the transmission coil 706 is rectangular in shape. As current flows through the transmission coil 706 energy is transferred to the first receiver coil 702 and second receiver coil 704 to produce a magnetic field and induce current in the induction loops as described above. Thus, a net voltage of zero is provided when current is induced to flow in both the first receiver coil 702 and second receiver coil 704. In this manner a conductive target 730 may be utilized in association with the circuitry to vary the voltage output of the circuitry from zero. Specifically, when the conductive target 730 is in a position adjacent the detection circuitry 700, the conductive target 730 shades, or prevents the loops of the from being energized, and the transmitted energy is dissipated as eddy currents and does not contribute to the induced voltage in the first receiver coil 702 or second receiver coil 704 in those locations adjacent the conductive target 730. This change in net voltage can then be detected to determine the position of the conductive target 730 relative to the detection circuitry 700. While in this arrangement five individual loops are formed with a net voltage of zero, in other embodiments detection circuitry 700 is provided with additional loops, varied sized loops, and the like that result in individual receiver coils that have a net voltage of zero such that voltage changes may be detected.

Figure 7B:
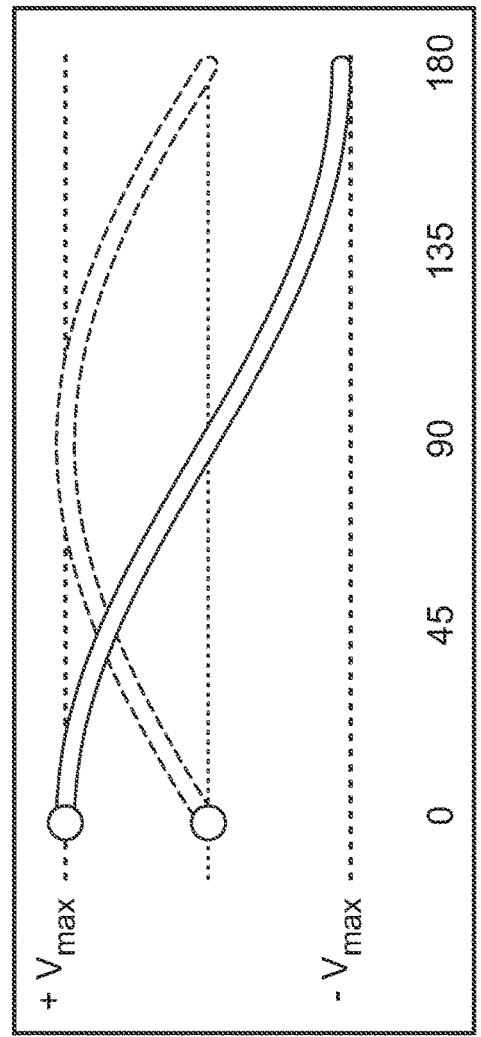
FIG. 7B is a graph of voltage over distance of the detection circuitry of FIG. 7A in accordance with an exemplary embodiment.

FIG. 7B provides a graph that illustrates how voltage varies over the cycle of each of the first receiver coil 702 and second receiver coil 704 based on the location of the target 730. Specifically, FIG. 7B is the graphical representation of a cycle when the conductive target 730 is in a position adjacent the detection circuitry 700.

As illustrated by the graph, when the conductive target 730 is in a position adjacent the detection circuitry 700, the conductive target 730 shades, or prevents the loops of the windings from being energized, and the transmitted energy is dissipated as eddy currents and does not contribute to the induced voltage in the first receiver coil 702 or second receiver coil 704 in those locations adjacent the conductive target 730. Therefore, based on the position and size of the conductive target an output voltage is placed on both the first receiver coil 702 and second receiver coil 704. Thus, when the detection circuitry 700 operates without a conductive target 730, no net voltage is provided. When a conductive target 730 is utilized, as the conductive target 730 moves, the output voltage of each receiver coil 702 and 704 is varied allowing for two separate voltage changes that may be detected and linearized by the processing circuitry.

In the example embodiment of FIG. 7A the conductive target 730 is configured to move along an axis 716 between a first target position and a second target position, wherein a dimension of the conductive target 730 measured along the axis 716 is approximately one half (½), or 50% of the size of the detection circuitry 700. While illustrated in these exemplary embodiments as half the size of the detection circuitry, in an embodiment when improved spatial characteristics are desired, such as when the conductive target 730 is within a float within an oil pan, the conductive target 730 may be less than half the size of the detection circuitry 700. In one embodiment the conductive target measured along the axis 716 is approximately 25% the size of the detection circuitry 700, and in another embodiment the conductive target 730 measured along the axis 716 is approximately is 18% the size of the detection circuitry 700. In yet another embodiment the size of the conductive target 730 measured along the axis 716 is approximately is in a range between 15% and 30% of the size of the detection circuitry 700. Thus, improved spatial characteristics are accomplished.

Figure 8A:
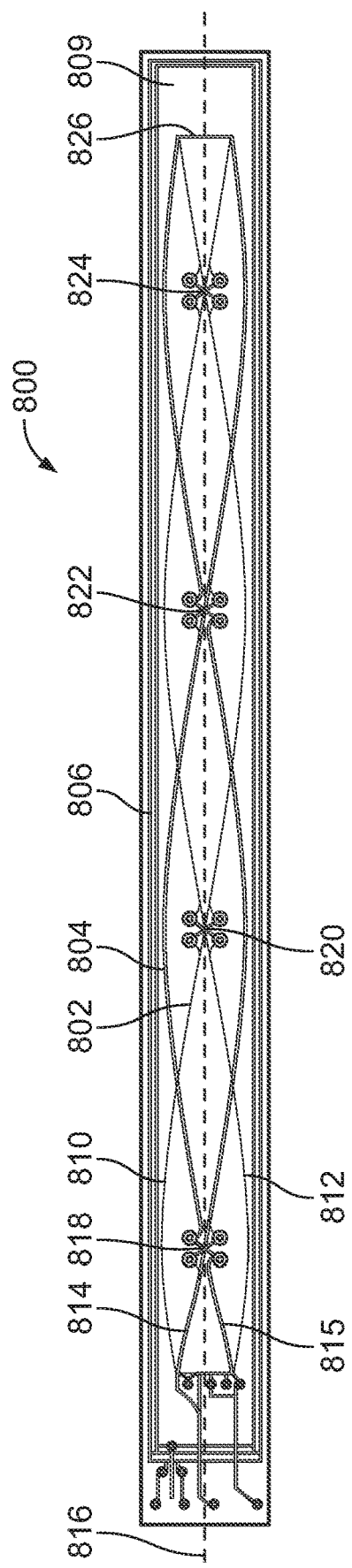
FIG. 8A is a side plan view of detection circuitry in accordance with an exemplary embodiment.
Figure 8B:
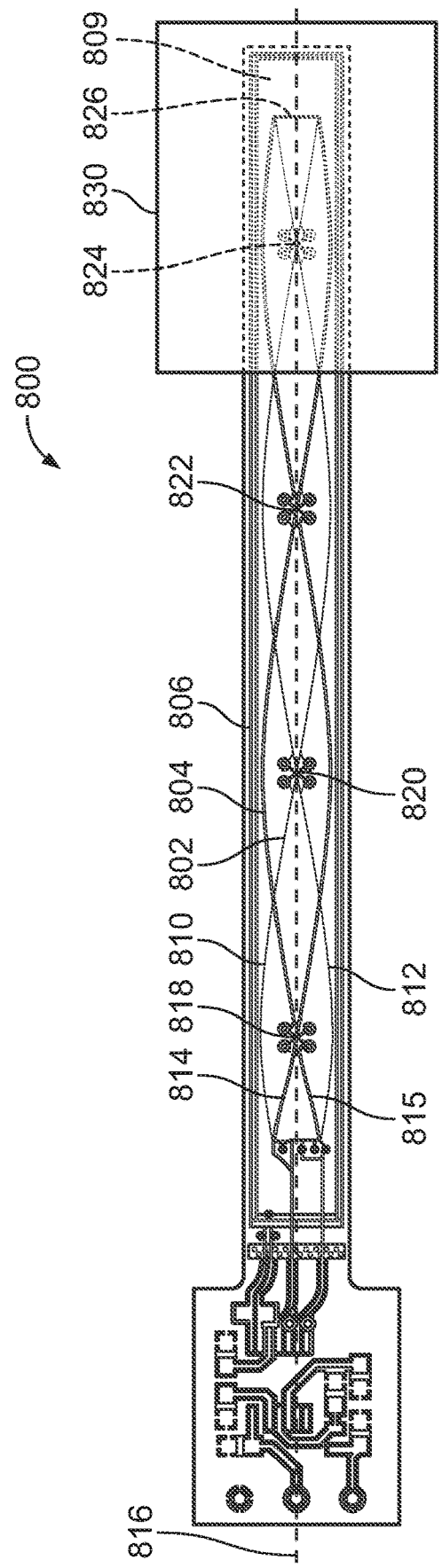
FIG. 8B is a side plan view of detection circuitry in accordance with an exemplary embodiment.

FIGS. 8A and 8B illustrate an alternative exemplary embodiment of detection circuitry 800 that may be used within the sensor assembly. The detection circuitry 800 in one example is the detection circuitry 224 of FIG. 2 and in another example is the detection circuitry 108 of FIG. 1. The detection circuitry 800 includes a first receiver coil 802, second receiver coil 804, and transmission coil 806.

The first receiver coil 802 includes a first sinusoidal section 810 and a second sinusoidal section 812. Similarly, the second receiver coil 804 also includes a first sinusoidal section 814 and second sinusoidal section 815. In one embodiment the substrate 809 is a printed circuit board (PCB) and the first receiver coil 802 and second receiver coil are both traces on the PCB. In yet another example, the substrate 809 includes environmental protection, such as in one embodiment a conformal coating that is applied after population of the circuitry. Thus, in exemplary embodiments where fluid container assembly is an oil pan, an environmentally protective coating is applied to the substrate to protect the circuitry from oil within the fluid container assembly. In this manner electrical components on the substrate 809 are protected from the oil, preventing malfunctioning. The detection circuitry 800 also includes a central axis 816 that includes first intersecting zero cross 818, second intersecting zero cross 820, third intersecting zero cross 822, and fourth intersecting zero cross 824.

The first sinusoidal section 810 and second sinusoidal section 812 of the first receiver coil 802 each extend sinusoidally in opposite directions to one another. At the first intersecting zero cross 818 the first sinusoidal section 810 is at a local maximum distance from the central axis 816 on a first side, while the second sinusoidal section 812 is at a local minimum distance from the central axis 816 on an opposite side. Then, at the second intersecting zero cross 820, the first sinusoidal section 810 and second sinusoidal section 812 overlap as each crosses the central axis 816. Similarly, at the third intersecting zero cross 822, again the first sinusoidal section 810 and second sinusoidal section 812 are at a maximum distance from the central axis 816 on opposite sides of the central axis 816 at a local minimum and local maximum. Then at the fourth intersecting zero cross 824, the first sinusoidal section 810 and second sinusoidal section 812 again converge overlapping one another. Each of the first sinusoidal section 810 and second sinusoidal section 812 extend past the fourth intersecting zero cross 824, extending an additional forty-five (45) degrees before both terminate at a straight section (not shown) that extends between thee first sinusoidal section 810 and second sinusoidal section 812 transverse to the central axis 816. Similarly, the starting end of the first sinusoidal section 810 and second sinusoidal section 812 are spaced apart at negative forty-five (−45) degrees, or three-hundred and fifteen (315) degree position. Thus, the full length of each of the first sinusoidal section 810 and second sinusoidal section 812 extends a full three-hundred and sixty (360) degrees, and a 45 degree phase shift is presented.

The first sinusoidal section 814 and second sinusoidal section 815 of the second receiver coil 804 each extend sinusoidally in opposite directions to one another. At the first intersecting zero cross 818 the first sinusoidal section 814 and second sinusoidal section 815 overlap as each crosses the central axis 816. At the second intersecting zero cross 820, the first sinusoidal section 814 and second sinusoidal section 815 are at a maximum distance from the central axis 816 on opposite sides of the central axis 816 at a local maximum and local minimum. Then at the third intersecting zero cross 822, the first sinusoidal section 814 and second sinusoidal section 815 again converge overlapping one another. At the fourth intersecting zero cross 824, the first sinusoidal section 814 and second sinusoidal section 815 again are at a maximum distance from the central axis 816 on opposite sides of the central axis 816 at a local maximum and local minimum. Each of the first sinusoidal section 814 and second sinusoidal section 815 extend past the fourth intersecting zero cross 824, extending an additional forty-five (45) degrees before both terminate at a linear section 826 that extends between the first sinusoidal section 814 and second sinusoidal section 815 transverse to the central axis 816 and overlapping the straight section of the first receiver coil 802. Similarly, the starting end of the first sinusoidal section 814 and second sinusoidal section 815 are spaced apart and are positioned at a negative forty-five (−45) degrees, or three-hundred and fifteen (315) degree position. Thus, the full length of each of the first sinusoidal section 814 and second sinusoidal section 815 extends a full three-hundred and sixty (360) degrees, and include a 45 degree phase shift.

The transmission coil 806 generally wraps around and forms a perimeter around the first receiver coil 802 and second receiver coil 804. In one embodiment the transmission coil 806 is rectangular in shape. As current flows through the transmission coil 806 energy is transferred to the first receiver coil 802 and second receiver coil 804 to produce a magnetic field and induce current in induction loops. In one example, when current is induced the individual receiver coils have a net voltage of zero such that voltage changes may be detected. When a conductive target 830 is disposed around the detection circuitry 800, the conductive target 830 shades, or prevents adjacent coil sections from being energized, and the transmitted energy is dissipated as eddy currents and does not contribute to the induced voltage in the first receiver coil 802 or second receiver coil 804 in those locations adjacent the conductive target 830. Therefore, based on the position and size of the conductive target, an output voltage is placed on both the first receiver coil 802 and second receiver coil 804 such that the position of the conductive target 830 along the detection circuitry 800 may be determined.

The conductive target 830 is provided in this exemplary embodiment as approximately twenty-five 25% the size of the detection circuitry. Consequently, spatial improvements are presented such that in example embodiments when the conductive target 830 may be used as a float within an oil pan. In another embodiment the conductive target 830 measured along the axis 816 is approximately is 18% the size of the detection circuitry 800. In yet another embodiment the size of the conductive target 830 measured along the axis 816 is approximately is in a range between 15% and 30% of the size of the detection circuitry 800. Thus, improved spatial characteristics are accomplished.

Figure 9:
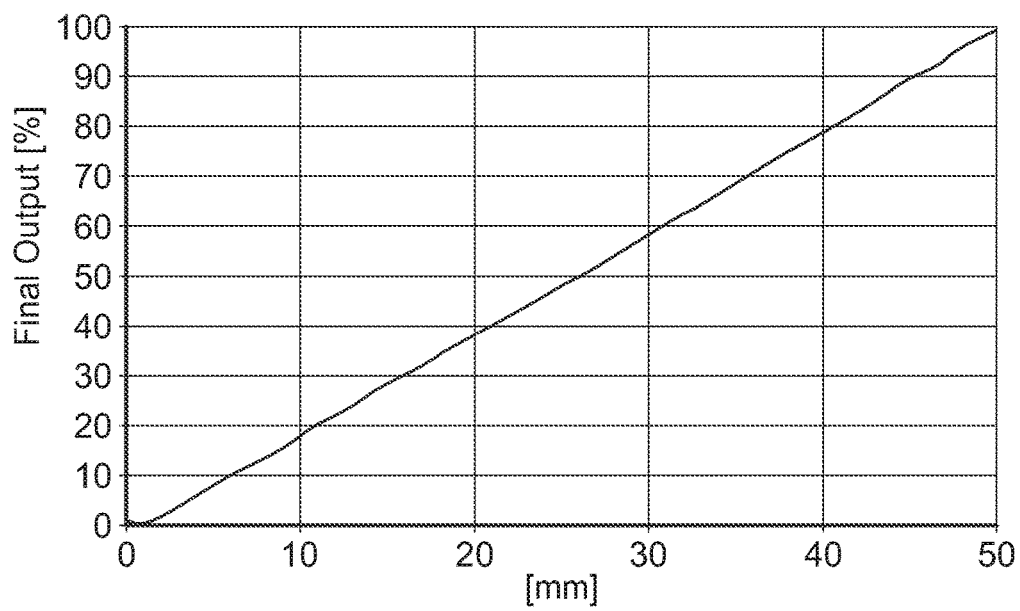
FIG. 9 is a graph of pulse width modulation percentage over distance in mm in accordance with an exemplary embodiment.

FIG. 9 illustrates a graph of an exemplary output curve after signal manipulation by processing circuitry. In one example, the processing circuitry is the processing circuitry 222 of the sensor assembly 200 of FIG. 2. In this example, in order to generate a linear, position dependent output signal, from the detection circuitry output signal, the processing circuitry demodulates voltages from a first receiver coil and second receiver coil. These demodulated voltages are then rectified, amplified, converted by successive approximation and transformed by the a tan function where:

$$x = a\tan(R_{x1}/R_{x2})$$

Where x is a linear position, $R_{x1}$ is the rectified, amplified, and converted output voltage of a first receiver coil and $R_{x2}$ is the rectified amplified, and converted output voltage of a second receiver coil. Thus, the processing circuitry provides a linear representation of position of the conductive target in relation to the stem section of the substrate.

In all, the sensor assembly 102, 200 provides processing circuitry 112, 222, and 412 within a sealed housing 209 and detection circuitry 108, 224, 414, 700, 800 within a fluid to determine the level of fluid within a chamber. In this manner the processing circuitry 112, 222 and 412 is protected from fluid, such as oil that may interfere with the processing and transmission of measurement taken based on the detection circuitry 108, 224, 414, 700, 800. Thus, the sensor assembly 102, 200 includes both a robust and spatially sufficient design. Additionally, by keeping the conductive target 110, 234, 418, 730, 830 in close proximity of the detection circuitry 108, 224, 414, 700, 800 to reduce air gap 424, 426 space, measurements are move accurate. In addition, in an embodiment with a four-layer detection circuitry, measurement accuracy is additionally enhanced. Thus, at the least all of the stated problems have been overcome.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A sensor assembly comprising:
a sealed housing;
processing circuitry disposed within the sealed housing;
detection circuitry extending from the sealed housing, the detection circuitry being secured to and extending along a substrate, the substrate including a first side and a second side, the detection circuitry including a first detection circuitry disposed on the first side of the substrate and a second detection circuitry identical to the first detection circuitry and disposed on the second side of the substrate; and
a conductive target movably coupled to the substrate to vary net voltage of the detection circuitry as the conductive target moves along the substrate to provide an output signal; and
wherein the processing circuitry determines the output signal and converts the output signal into a linear representation of position of the conductive target in relation to the substrate.

2. The sensor assembly of claim 1, wherein the conductive target includes a first side positioned adjacent the first detection circuitry and a second side positioned adjacent the second detection circuitry.

3. The sensor assembly of claim 2, wherein the conductive target surrounds the substrate at the detection circuitry.

4. The sensor assembly of claim 1, wherein the substrate has an environmentally protective coating.

5. The sensor assembly of claim 1, wherein the conductive target is configured to move along an axis between a first target position and a second target position, wherein a dimension of the conductive target measured along the axis is between 15% and 30% of a distance between the first and second target positions.

6. The sensor assembly of claim 1, wherein the sealed housing is configured to couple to an opening of a fluid container assembly and the substrate and the conductive target are configured to be disposed within a volume of the fluid container assembly.

7. The sensor assembly of claim 6, wherein the fluid container assembly is an oil pan and the substrate and the conductive target are configured to be disposed within a dip-stick channel of the oil pan.

8. The sensor assembly of claim 1, further comprising:
an open housing sealingly coupled to the sealed housing and including an opening to allow fluid to flow into an interior chamber of the open housing.

9. The sensor assembly of claim 8, further comprising:
potting within the sealed housing and surrounding the substrate to prevent ingress of the fluid into the sealed housing from the open housing.

10. The sensor assembly of claim 9, wherein the open housing receives a cover member that is configured to position the conductive target about the substrate.

11. The sensor assembly of claim 1, wherein each of the first detection circuitry and the second detection circuitry includes a first sinusoidal receiver coil, a second sinusoidal receiver coil having a phase that is different than the first sinusoidal receiver coil, and a transmission coil that surrounds the first sinusoidal receiver coil and second sinusoidal receiver coil to induce current within the first sinusoidal receiver coil and second sinusoidal receiver coil, each of the first detection circuitry and the second detection circuitry has a net voltage of zero.

12. The sensor assembly of claim 11, wherein movement of the conductive target adjacent the detection circuitry varies the net voltage of the detection circuitry.

13. An oil pan assembly comprising:
a container configured to contain oil;
a sensor assembly mounted within the container, the sensor assembly comprising:
a sealed housing;
a substrate including a first section that includes processing circuitry disposed within the sealed housing and a second section that includes detection circuitry extending from the sealed housing into the container, the second section of the substrate includes a first side and a second side, the detection circuitry includes a first detection circuitry disposed on the first side of the substrate and a second detection circuitry identical to the first detection circuitry and disposed on the second side of the substrate; and
a float having a conductive target coupled to the second section of the substrate within the container to move along the second section as an oil level of the oil within the container varies.

14. The oil pan assembly of claim 13, wherein the float surrounds the second section of the substrate.

15. The oil pan assembly of claim 13, wherein the processing circuitry is configured to transmit an oil level reading to a computing device of a vehicle.

16. The oil pan assembly of claim 15, wherein the substrate is a printed circuit board and the sealed housing includes a port with an electric terminal that electrically connects to the printed circuit board and is configured to transmit the oil level reading to the computing device.

17. The oil pan assembly of claim 15, further comprising an open housing coupled to the sealed housing wherein the second section of the substrate extends through the open housing and the float is disposed within the open housing, the housing including an opening to allow the oil to flow therein.

18. The oil pan assembly of claim 17, wherein the open housing is made of a conductive material.

19. A sensor assembly comprising:
a sealed housing;
a printed circuit board assembly including a first section that includes processing circuitry disposed within the sealed housing and a second section extending from the sealed housing, the second section includes a first side that includes first detection circuitry and a second side that includes second detection circuitry identical to the first detection circuitry;
a conductive target movably surrounding the second section of the printed circuit board to vary net voltage of the first detection circuitry and second detection circuitry as the conductive target moves along the second section to provide an output signal;
wherein the processing circuitry determines the output signal and converts the output signal into a linear representation of position of the conductive target in relation to the second section; and
wherein the conductive target is configured to move along an axis between a first target position and a second target position, wherein a dimension of the conductive target measured along the axis is between 15% and 30% of a distance between the first and second target positions.

20. The sensor assembly of claim 19, further comprising:
an open housing sealingly coupled to the sealed housing and receiving the second section of the printed circuit board assembly and the conductive target.

21. A sensor assembly comprising:
a sealed housing;
processing circuitry disposed within the sealed housing;
detection circuitry extending from the sealed housing, the detection circuitry being secured to and extending along a substrate; and
a conductive target movably coupled to the substrate to vary net voltage of the detection circuitry as the conductive target moves along the substrate to provide an output signal; and
wherein the processing circuitry determines the output signal and converts the output signal into a linear representation of position of the conductive target in relation to the substrate, the sealed housing is configured to couple to an opening of a fluid container assembly and the substrate and the conductive target are configured to be disposed within a volume of the fluid container assembly, the fluid container assembly is an oil pan and the substrate and the conductive target are configured to be disposed within a dip-stick channel of the oil pan.

* * * * *